United States Patent [19]
See et al.

[11] Patent Number: 6,103,594
[45] Date of Patent: Aug. 15, 2000

[54] METHOD TO FORM SHALLOW TRENCH ISOLATIONS

[75] Inventors: Alex See, Singapore, Singapore; Lap Chan, San Francisco, Calif.

[73] Assignee: Chartered Semiconductor Manufacturing Ltd., Singapore, Singapore

[21] Appl. No.: 09/392,393

[22] Filed: Sep. 9, 1999

[51] Int. Cl.[7] .................................................. H01L 21/761
[52] U.S. Cl. ........................................... 438/427; 438/429
[58] Field of Search ..................................... 438/427, 429, 438/FOR 227

[56] References Cited

U.S. PATENT DOCUMENTS

| | | |
|---|---|---|
| 4,942,137 | 7/1990 | Sivan et al. . |
| 5,087,586 | 2/1992 | Chan et al. . |
| 5,223,736 | 6/1993 | Rodder . |
| 5,236,863 | 8/1993 | Iranmanesh . |
| 5,384,280 | 1/1995 | Aoki et al. . |
| 5,424,240 | 6/1995 | Han . |
| 5,436,190 | 7/1995 | Yang et al. . |
| 5,681,776 | 10/1997 | Hebert et al. . |
| 5,731,221 | 3/1998 | Kwon . |

*Primary Examiner*—George Fourson
*Assistant Examiner*—Joannie A. Garcia
*Attorney, Agent, or Firm*—George O. Saile; Rosemary L. S. Pike

[57] ABSTRACT

A method of forming shallow trench isolations is achieved. STI structures so formed do not exhibit isolation oxide thinning due to dishing and erosion problems during the oxide CMP process. A silicon substrate is provided. A first dielectric layer is formed overlying the silicon substrate. A silicon nitride layer is deposited. The silicon nitride layer, the first dielectric layer, and the silicon substrate are etched to form trenches for planned shallow trench isolations. A second dielectric layer is deposited overlying the silicon nitride layer and the trenches. The second dielectric layer is etched to form sidewall spacers inside the trenches. A silicon layer is selectively grown overlying the silicon substrate only where the silicon substrate is exposed in the trenches, and wherein the step of growing is stopped before the silicon layer exceeds the top surface of the silicon nitride layer. A third dielectric layer is deposited overlying the silicon nitride layer, the sidewall spacers, and the silicon layer. The third dielectric layer is polished down to the top surface of the silicon nitride layer to complete the shallow trench isolations where the silicon nitride layer acts as a polishing stop, and the integrated circuit device is completed.

20 Claims, 3 Drawing Sheets

METHOD TO FORM SHALLOW TRENCH ISOLATIONS

BACKGROUND OF THE INVENTION (1) Field of the Invention

The invention relates to a method of fabricating silicon structures, and more particularly, to the formation of shallow trench isolations in the manufacture of integrated circuit devices.

(2) Description of the Prior Art

The use of shallow trench isolation (STI) for the formation of integrated circuit isolations has grown in the art due to the reduced surface area and improved topology of STI when compared to traditional local oxidation of silicon (LOCOS) schemes. One problem that is encountered in the use of STI is oxide dishing. Oxide dishing occurs, in part, due to pad deformation in the chemical mechanical polish (CMP) process used to planarize the STI structures. It is called dishing because the STI isolation oxide takes on the shape of a dish as the oxide in the trench is thinned by the CMP process. Dishing is especially pronounced on large or wide STI structures because the isolation oxide over these trenches is typically thinner than the oxide deposited over narrow trenches due to topological effects. Narrower STI structures demonstrate little or no dishing. Another problem in the prior art is oxide erosion during the CMP process.

Referring to FIG. 1, a cross-section of a partially completed prior art integrated circuit is shown. A silicon substrate 10 is shown. Two narrow trenches and one wide trench have been etched into the surface of the silicon substrate 10. An isolation oxide layer 14 fills the trenches. A chemical mechanical polish (CMP) was used to polish down the isolation oxide layer 14 to the top surface of the silicon substrate 10 to complete the shallow trench isolations. Following the polish, however, significant dishing 18 occurred over the widest trench. This dishing 18 can cause increased current leakage and decreased gate oxide voltage breakdown. These problems at the active area interface reduce device yield.

One technique used in the prior art to reduce the oxide dishing and erosion problems is the use of dummy lines. In the dummy lines approach, strips of active area are added in sections to reduce the width of the isolation regions and, thereby, to reduce oxide dishing and erosion. Reverse mask may also used to reduce these problems. Unfortunately, both of these approaches add cost to the manufacturing process.

Several prior art approaches disclose methods to create isolation regions in the silicon substrate. U.S. Pat. No. 5,681,776 to Hebert et al discloses a method to form isolation regions where trenches are etched. Dielectric spacers are formed in the trenches. Silicon plugs are grown in the trenches by selective epitaxial growth (SEG). The silicon plugs are then thermally oxidized to entirely convert the silicon into silicon dioxide. An etch down is then performed to remove dielectric layers overlying active regions and to planarize the structure. U.S. Pat. No. 5,087,586 to Chan et al teaches a process to form isolation regions where trenches are formed with dielectric spacers on the sidewalls. SEG layers are formed in the trenches. The SEG layers are thermally oxidized to convert the silicon to silicon dioxide. Additional silicon dioxide is deposited to fill voids. The surface is then planarized by etching down. U.S. Pat. No. 5,223,736 to Rodder discloses a process to form isolation regions by first forming a reduced topography field oxide region. A trench is formed in the field oxide and then a polysilicon plug is selectively deposited in the trench. The polysilicon plug is then thermally oxidized to form a silicon dioxide layer thereover. U.S. Pat. No. 4,942,137 to Sivan et al discloses a process to form isolation regions where a selective trench filling process is used to deposit, for example, polysilicon into an oxide-lined trench. A thermal oxidation is performed to cap the polysilicon fill layer. U.S. Pat. No. 5,731,221 to Kwon shows a process to form isolation regions where a local oxidation of silicon (LOCOS) region is formed. A trench is etched through the LOCOS region. After sidewall spacers are formed inside the trench, a second, deeper trench is etched into the substrate. A silicon dioxide layer is deposited to fill the trench. A chemical mechanical polish (CMP) is performed to planarize the surface. U.S. Pat. No. 5,424,240 to Han teaches a process to form isolation regions where a trench is etched and filled with polysilicon. After a CMP step, sidewall spacers are formed over the polysilicon and are then used as an etching mask for an etch into the polysilicon of a second, deeper trench. The polysilicon is then thermally oxidized to completely convert the polysilicon into silicon dioxide. U.S. Pat. No. 5,436,190 to Yang et al discloses a process to form isolation regions where a trench is etched into the silicon substrate. Sidewall spacers are formed in the trench. A polysilicon layer is deposited to fill the trench. A CMP step is performed to planarize the polysilicon. The sidewall spacers are then removed. The polysilicon is thermally oxidized to form a silicon dioxide layer to encapsulate the polysilicon plug.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations in which isolation oxide dishing and erosion are eliminated.

A yet further object of the present invention is to eliminate isolation oxide dishing and erosion in shallow trench isolations by forming silicon plugs in the trenches to eliminate the topology problems that cause oxide dishing.

In accordance with the objects of this invention, a new method of fabricating shallow trench isolations has been achieved. A silicon substrate is provided. A first dielectric layer is formed overlying the silicon substrate. A silicon nitride layer is deposited overlying the first dielectric layer. The silicon nitride layer, the first dielectric layer, and the silicon substrate are patterned to form trenches for planned shallow trench isolations. A second dielectric layer is deposited overlying the silicon nitride layer and the trenches. The second dielectric layer is etched to form sidewall spacers inside the trenches. A silicon layer is grown overlying the silicon substrate, wherein the step of growing is selective to grow only where the silicon substrate is exposed in the trenches, and wherein the step of growing is stopped before the silicon layer exceeds the top surface of the silicon nitride layer. A third dielectric layer is deposited overlying the silicon nitride layer, the sidewall spacers, and the silicon layer. The third dielectric layer is polished down to the top surface of the silicon nitride layer to complete the shallow trench isolations, where the silicon nitride layer acts as a polishing stop, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
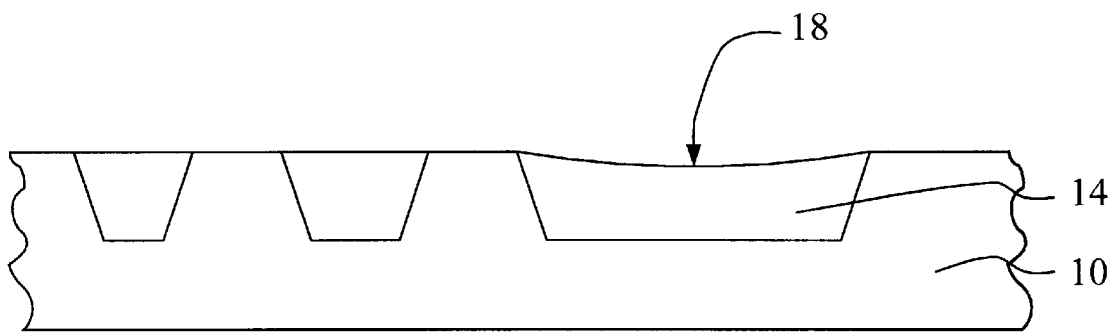
FIG. 1 schematically illustrates in cross-section partially completed prior art shallow trench isolations in an integrated circuit device.
Figure 2:
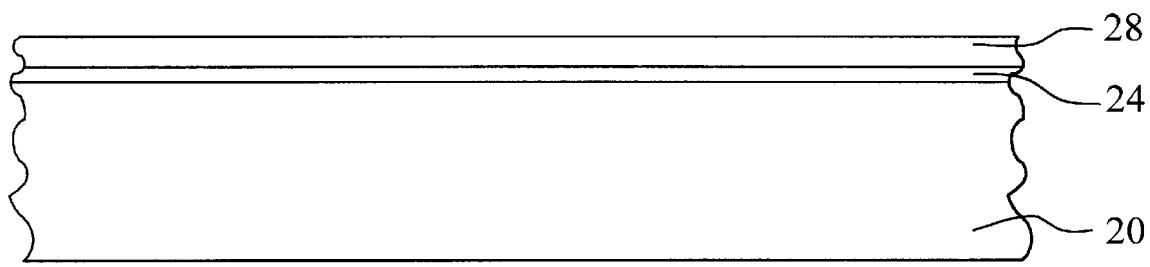
FIGS. 2 through 8 schematically illustrate in cross-sectional representation a preferred embodiment of the present invention.

Referring now more particularly to FIG. 2, there is illustrated a cross section of a partially completed integrated circuit device. The silicon substrate 20 is preferably composed of monocrystalline silicon. A first dielectric layer 24 is formed overlying the silicon substrate 20. The first dielectric layer 24 is preferably comprised of silicon dioxide that is thermally grown. The purpose of the first dielectric layer 24 is to act as a pad layer to reduce stress in the silicon substrate 20 during subsequent processing steps. The first dielectric layer 24 is preferably grown to a thickness of between about 100 Angstroms and 200 Angstroms.

Figure 3:
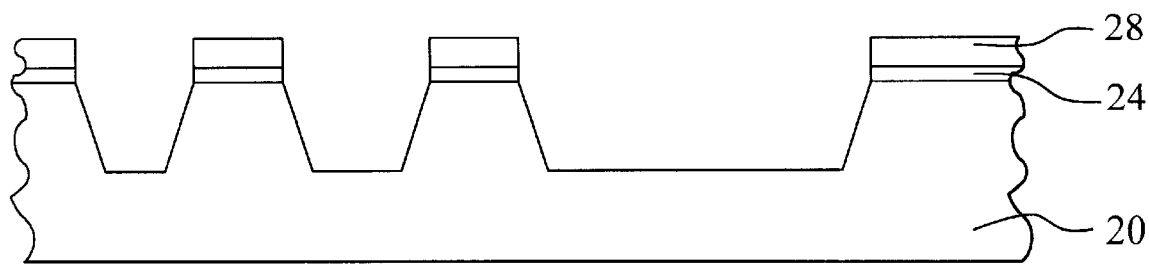

A silicon nitride layer 28 is deposited overlying the first dielectric layer 24. The silicon nitride layer 28 is preferably deposited using a low-pressure chemical vapor deposition (LPCVD) process. The silicon nitride layer 28 serves several purposes that are important aspects of the present invention. First, the silicon nitride layer 28 is used as an etching stop during the formation of sidewall spacers. Second, the silicon nitride layer 28 is a polishing stop for the polish down of the dielectric material used to fill the final shallow trench isolations. In the preferred embodiment, the silicon nitride layer 28 is deposited to a thickness of between about 1,000 Angstroms and 2,500 Angstroms. Referring now to FIG. 3, the silicon nitride layer 28, the first dielectric layer 24, and the silicon substrate 20 are etched where not protected by a mask, that is not shown, to form trenches for planned shallow trench isolations. The etching step is done using a conventional reactive ion etch (RIE). An etching chemistry of $CHF_3$, $CF_4$, and $O_2$ is used to pattern the nitride hard mask. An etching chemistry of HBr, $Cl_2$, and $O_2$ is used for the silicon trench etch. As in the prior art example, both narrow and wide trenches can be used in the present invention as shown.

Figure 4:
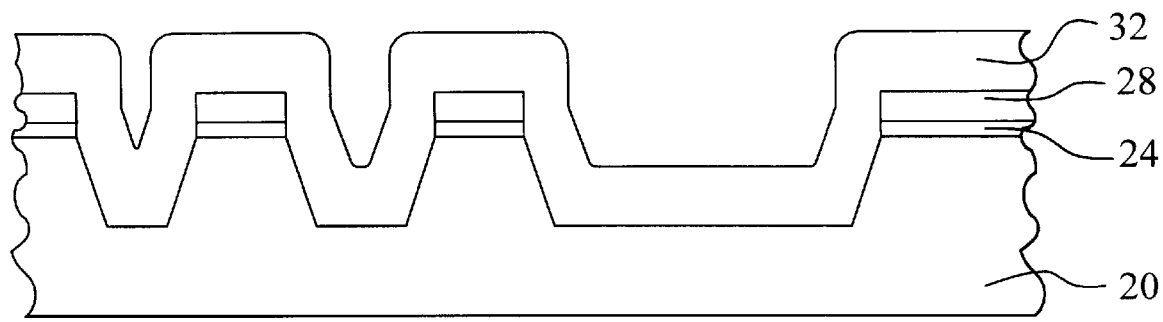

Referring now to FIG. 4, a second dielectric layer 32 is deposited overlying the silicon nitride layer 28 and the trenches. The second dielectric layer 32 may be comprised of either silicon dioxide or silicon nitride. In the preferred embodiment, the second dielectric layer 32 is silicon dioxide deposited by low-pressure chemical vapor deposition (LPCVD). The second dielectric layer 32 is preferably deposited to a thickness of between about 1,000 Angstroms and 3,000 Angstroms.

Figure 5:
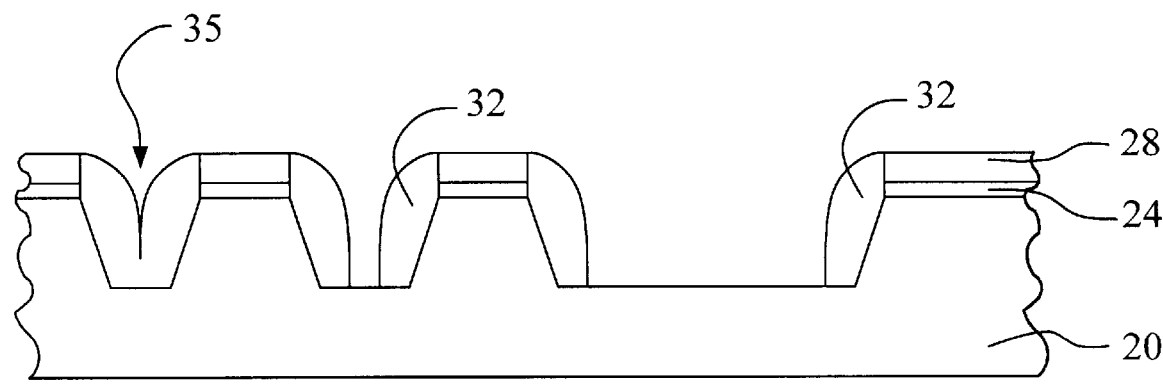

Referring now to FIG. 5, an important aspect of the present invention is described. The second dielectric layer 32 is etched to form sidewall spacers inside the trenches. The etching step is anisotropic and removes the second dielectric layer 32 from lateral surfaces while forming the sidewall spacers shown. The etching process used is well known in the art and comprises a RIE process using an etching chemistry of $CHF_3$ and $CF_4$.

The sidewall spacers 32 are important for two reasons. First, the sidewall spacers 32 insure that a good dielectric isolation is formed along the edges of the shallow trench isolations. Second, and particular to the present invention, the sidewall spacers 32 define areas in trenches where silicon will not be grown in the subsequent process step. Without the sidewall spacers 32, the silicon plugs would be formed too close to the edges of the trenches to allow for an effective isolation dielectric. Finally, the sidewall spacers 32 are self-aligned to the edges of the trenches and, therefore, no masking operation is required to form them. Note that narrow trenches may be completely filled by the dielectric spacers 35.

Figure 6:
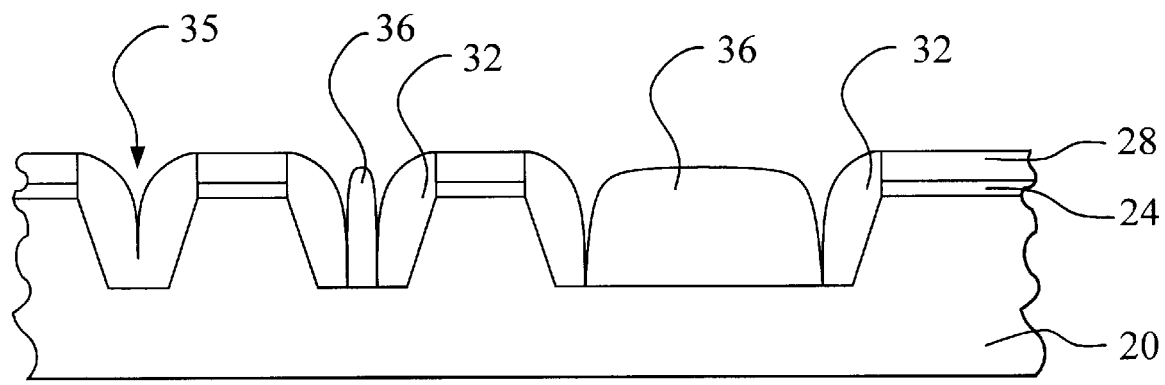

Referring now to FIG. 6, another important aspect of the present invention is described. A silicon layer 36 is grown overlying the silicon substrate 20. This step of growing silicon is selective to grow only where the silicon substrate 20 is exposed in the trenches. Therefore, no silicon is grown in the narrowest trenches 35. In addition, the step of growing silicon is stopped before the silicon layer 36 exceeds the top surface of the silicon nitride layer 28. The silicon layer 36 is grown using a selective epitaxial growth (SEG) process in an epitaxial reactor. The process occurs at a temperature of between about 600 degrees C and 1200 degrees C and a pressure of between about 1 Torr and 100 Torr. The SEG process uses a silicon source chemistry of either: $SiH_4$, $SiH_2Cl_2$ and $H_2$, $SiHCl_3$ and $H_2$, or $SiCl_4$ and $H_2$.

The SEG process will only grow the silicon layer 36 on the exposed silicon substrate 20. Therefore, the silicon nitride layer 28 and the sidewall spacers 32 confine the silicon layer 36 so formed to the trenches. In addition, the SEG process is stopped before the silicon layer 32 grows above the top surface of the silicon nitride layer 28. This will allow a subsequently deposited dielectric layer to completely cover the silicon layer 32, even after a polish down operation.

Figure 7:
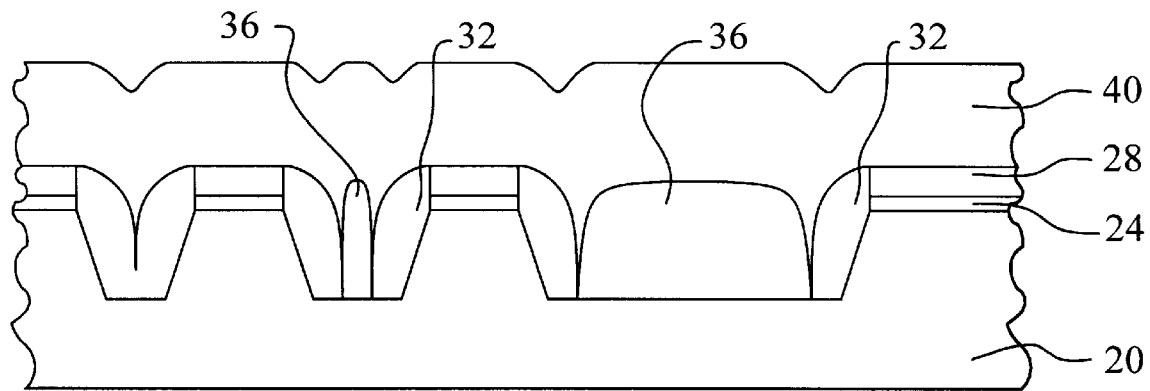

Referring now to FIG. 7, another significant feature of the present invention is described. A third dielectric layer 40 is deposited overlying the silicon nitride layer 28, the sidewall spacers 32, and the silicon layer 36. The purpose of the third dielectric layer is to provide an encapsulating isolation overlying the silicon layer 36. The third dielectric layer 40 may be composed of several dielectric materials available. In the preferred embodiment, the third dielectric layer 40 is a chemical vapor deposition (CVD) deposited silicon dioxide. The third dielectric layer 40 is deposited to a thickness of between about 3,000 Angstroms and 5,000 Angstroms.

It is significant that the present invention does not use a thermal oxidation of the silicon layer 36 to achieve the isolation and planarity objectives of the shallow trench isolation structure. It is not necessary that the silicon layer 36 be thermally oxidized into silicon dioxide as is seen in some prior art approaches. While the present invention does not exclude thermal oxidation of the epitaxially grown silicon layer 36 as a means of achieving planarization, it is not necessary. The present invention demonstrates that good isolation and planarity are achieved though the use of a CVD silicon dioxide deposition and planarization without thermal oxidation. In addition, it has been shown in manufacturing that shallow trench isolations that contain silicon dummy lines are effective isolations as long as the silicon is adequately encapsulated by a dielectric layer.

Figure 8:
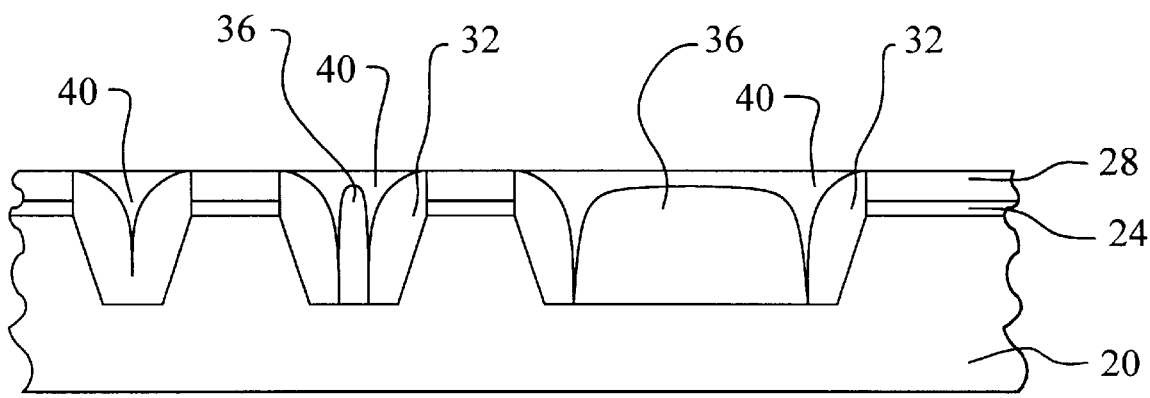

Referring now to FIG. 8, a last important step in the present invention is shown. The third dielectric layer 40 is polished down to the top surface of the silicon nitride layer 28 to complete the shallow trench isolations. The silicon nitride layer 28 acts as a polishing stop. The polishing down step is preferably performed using a conventional chemical mechanical polish (CMP) that is selective to silicon dioxide while more slowly attacking silicon nitride. This step demonstrates the importance of both the presence of the silicon nitride layer 28 and the aforementioned stopping of the SEG process before the silicon layer 36 exceeds the silicon nitride layer 28 top surface. The polishing operation is stopped once the third dielectric layer 40 is sufficiently removed to reveal the silicon nitride layer 28. As can be seen, the resulting shallow trench isolations are both fully isolating and planar. The integrated circuit device may then be completed as conventional in the art.

Significantly, no dishing is seen overlying the region of the widest trench. Elimination of dishing and erosion will also eliminate the problems of increased current leakage, decreased gate oxide voltage breakdown, and reduced device yield.

As shown in the preferred embodiment, the present invention provides a very manufacturable process for fabricating shallow trench isolations that eliminate isolation oxide dishing and erosion in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolations in the manufacture of an integrated circuit device comprising:

forming a first dielectric layer overlying a silicon substrate;

depositing a silicon nitride layer overlying said first dielectric layer;

patterning said silicon nitride layer, said first dielectric layer, and said silicon substrate to form trenches into said silicon substrate for planned said shallow trench isolations;

depositing a second dielectric layer overlying said silicon nitride layer and said trenches;

anisotropically etching said second dielectric layer to form sidewall spacers inside said trenches;

selectively growing a silicon layer where said silicon substrate is exposed in said trenches wherein said silicon layer does not surpass the top surface of said silicon nitride layer;

depositing a third dielectric layer overlying said silicon nitride layer, said sidewall spacers, and said silicon layer; and polishing down said third dielectric layer to the top surface of said silicon nitride layer wherein said silicon nitride layer acts as a polishing stop to complete said shallow trench isolations in the fabrication of said integrated circuit device.

2. The method according to claim 1 wherein said first dielectric layer comprises silicon dioxide.

3. The method according to claim 1 wherein said first dielectric layer is formed to a thickness of between about 100 Angstroms and 300 Angstroms.

4. The method according to claim 1 wherein said silicon nitride layer is deposited to a thickness of between about 1,000 Angstroms and 2,500 Angstroms.

5. The method according to claim 1 wherein said second dielectric layer comprises one of the group consisting of: silicon dioxide and silicon nitride.

6. The method according to claim 1 wherein said step of selectively growing said silicon layer is by a selective epitaxial growth process in an epitaxial reactor at a temperature of between about 600 degrees C and 1,200 degrees C, a pressure of between about 1 Torr and 100 Torr, using a chemistry comprising one of the group consisting of: $SiH_4$, $SiH_2Cl_2$ and $H_2$, $SiHCl_3$ and $H_2$, and $SiCl_4$ and $H_2$.

7. The method according to claim 1 wherein said third dielectric layer comprises silicon dioxide.

8. The method according to claim 1 wherein said third dielectric layer is deposited to a thickness of between about 3,000 Angstroms and 5,000 Angstroms.

9. The method according to claim 1 wherein said step of polishing down said third dielectric layer is by chemical mechanical polishing.

10. A method of forming shallow trench isolations in the manufacture of an integrated circuit device comprising:

growing a first silicon dioxide layer overlying a silicon substrate;

depositing a silicon nitride layer overlying said first silicon dioxide layer;

patterning said silicon nitride layer, said first silicon dioxide layer, and said silicon substrate to form trenches within said silicon substrate for planned said shallow trench isolations;

depositing a second dielectric layer overlying said silicon nitride layer and said trenches;

anisotropically etching said second dielectric layer to form sidewall spacers inside said trenches;

selectively growing a silicon layer where said silicon substrate is exposed in said trenches wherein said step of growing is stopped before said silicon layer exceeds the top surface of said silicon nitride layer;

depositing a silicon dioxide isolation layer overlying said silicon nitride layer, said sidewall spacers, and said silicon layer;

polishing down said silicon dioxide isolation layer to the top surface of said silicon nitride layer to complete said shallow trench isolations wherein said silicon nitride layer acts as a polishing stop; and completing the fabrication of said integrated circuit device.

11. The method according to claim 10 wherein said first silicon dioxide layer is grown to a thickness of between about 100 Angstroms and 200 Angstroms.

12. The method according to claim 10 wherein said silicon nitride layer is deposited to a thickness of between about 1,000 Angstroms and 2,500 Angstroms.

13. The method according to claim 10 wherein said second dielectric layer comprises one of the group consisting of: silicon dioxide and silicon nitride.

14. The method according to claim 10 wherein said step of selectively growing said silicon layer is by a selective epitaxial growth process in an epitaxial reactor at a temperature of between about 600 degrees C and 1,200 degrees C, a pressure of between about 1 Torr and 100 Torr, using a chemistry comprising one of the group consisting of: $SiH_4$, $SiH_2Cl_2$ and $H_2$, $SiHCl_3$ and $H_2$, and $SiCl_4$ and $H_2$.

15. The method according to claim 10 wherein said silicon dioxide isolation layer is deposited to a thickness of between about 3,000 Angstroms and 5,000 Angstroms.

16. The method according to claim 10 wherein said step of polishing down said silicon dioxide isolation layer is by chemical mechanical polishing.

17. A method of forming shallow trench isolations in the manufacture of an integrated circuit device comprising:

providing a silicon substrate;

growing a first silicon dioxide layer overlying said silicon substrate;

depositing a silicon nitride layer overlying said first silicon dioxide layer;

patterning said silicon nitride layer, said first silicon dioxide layer, and said silicon substrate to form trenches within said silicon substrate for planned said shallow trench isolations wherein there are at least one narrow trench and at least one wide trench;

depositing a second silicon dioxide layer overlying said silicon nitride layer and said trenches;

anisotropically etching said second silicon dioxide layer to form sidewall spacers inside said trenches wherein said silicon substrate is exposed at the bottom of said wide trench and wherein said silicon substrate is not exposed at the bottom of said narrow trench;

selectively growing a silicon where said silicon substrate is exposed in said trenches wherein said step of growing is stopped before said silicon layer exceeds the top surface of said silicon nitride layer;

depositing a silicon dioxide isolation layer overlying said silicon nitride layer, said sidewall spacers, and said silicon layer; and polishing down said silicon dioxide isolation layer to the top surface of said silicon nitride layer wherein said polishing down is by chemical mechanical polishing and wherein said silicon nitride layer acts as a polishing stop to complete said shallow trench isolations.

18. The method according to claim 17 wherein said first silicon dioxide layer is grown to a thickness of between about 100 Angstroms and 200 Angstroms.

19. The method according to claim 17 wherein said silicon nitride layer is deposited to a thickness of between about 1,000 Angstroms and 2,500 Angstroms.

20. The method according to claim 17 wherein said step of selectively growing said silicon layer is by a selective epitaxial growth process in an epitaxial reactor at a temperature of between about 600 degrees C and 1,200 degrees C, a pressure of between about 1 Torr and 100 Torr, sing a chemistry comprising one of the group consisting of: $SiH_4$, $SiH_2Cl_2$ and $H_2$, $SiHCl_3$ and $H_2$, and $SiCl_4$ and $H_2$.

* * * * *